(12) United States Patent
Behzadnezhad et al.

(10) Patent No.: US 10,520,575 B2
(45) Date of Patent: Dec. 31, 2019

(54) SYSTEM AND METHOD FOR ELECTRON PARAMAGNETIC RESONANCE IMAGING USING TRANSMISSION LINES TO GENERATE TRAVELING WAVES

(71) Applicant: Wisconsin Alumni Research Foundation, Madison, WI (US)

(72) Inventors: Bahareh Behzadnezhad, Madison, WI (US); Nader Behdad, Oregon, WI (US); Alan B. McMillan, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 236 days.

(21) Appl. No.: 15/606,811

(22) Filed: May 26, 2017

(65) Prior Publication Data
US 2018/0340999 A1    Nov. 29, 2018

(51) Int. Cl.
*G01R 33/60*      (2006.01)
*G01R 33/36*      (2006.01)
*G01R 33/38*      (2006.01)

(52) U.S. Cl.
CPC ......... *G01R 33/60* (2013.01); *G01R 33/3607* (2013.01); *G01R 33/38* (2013.01)

(58) Field of Classification Search
CPC .. G01R 33/60; G01R 33/345; G01R 33/4802; G01R 33/38; G01R 33/3607
USPC ...................................................... 324/322
See application file for complete search history.

(56) References Cited

U.S. PATENT DOCUMENTS

| | | | | |
|---|---|---|---|---|
| 5,619,139 | A * | 4/1997 | Holczer | G01Q 60/08 324/300 |
| 8,664,955 | B1 * | 3/2014 | Halpern | G01R 33/60 324/316 |
| 2011/0270073 | A1 * | 11/2011 | Ardenkjaer-Larsen | G01R 33/60 600/410 |
| 2012/0223709 | A1 * | 9/2012 | Schillak | G01R 33/3607 324/309 |
| 2014/0091802 | A1 * | 4/2014 | Yang | G01R 33/60 324/322 |
| 2015/0323622 | A1 * | 11/2015 | Wang | G01R 33/345 324/318 |

OTHER PUBLICATIONS

Acharya A, et al., Redox regulation in cancer: a double-edged sword with therapeutic potential. Oxid Med Cell Longev. 2010;3(1):23-34.

(Continued)

*Primary Examiner* — Christopher P McAndrew
(74) *Attorney, Agent, or Firm* — Quarles & Brady LLP

(57) ABSTRACT

A system and method for an electron paramagnetic resonance imaging (EPRI) system includes a magnet configured to apply a static magnetic field to a subject to be imaged and a gradient coil configured to apply a magnetic field gradient to the static magnetic field. The system also includes a parallel plate waveguide (PPWG) configured to use a traveling wave to generate a radio frequency (RF) magnetic field over a volume of interest (VOI) in the subject to elicit EPRI data from the VOI and a processor configured to reconstruct the EPRI data into an image of the VOI.

21 Claims, 6 Drawing Sheets

(56) References Cited

OTHER PUBLICATIONS

Ahmad R, et al., Theory, instrumentation, and applications of electron paramagnetic resonance oximetry. Chem Rev. May 12, 2010;110(5):3212-36.

Ahunbay E, et al., Rapid method for deblurring spiral MR images. Magn Reson Med. Sep. 2000;44(3):491-4.

Bao B, et al., Hypoxia induced aggressiveness of prostate cancer cells is linked with deregulated expression of VEGF, IL-6 and miRNAs that are attenuated by CDF. PLoS One. Jan. 2012;7(8):e43726.

Beatty PJ, et al., Rapid gridding reconstruction with a minimal oversampling ratio. IEEE Trans Med Imaging. Jun. 2005;24(6):799-808.

Bernstein MA, Huston J, Ward HA. Imaging artifacts at 3.0T. Journal of Magnetic Resonance Imaging. 2006. p. 735-746.

Biller JR, et al., Imaging of nitroxides at 250MHz using rapid-scan electron paramagnetic resonance. J Magn Reson. Mar. 1, 2014;242:162-8.

Breuer FA, et al., Controlled aliasing in parallel imaging results in higher acceleration (CAIPIRINHA) for multi-slice Imaging. Magn Reson Med. Mar. 2005;53(3):684-91.

Brunner DO, et al., Travelling-wave nuclear magnetic resonance. Nature. 2009;457(February):994-998.

Caia GL, et al., Organ specific mapping of in vivo redox state in control and cigarette smoke-exposed mice using EPR/NMR co-imaging. J Magn Reson. United States; Mar. 2012;216:21-27.

Chaiswing L, et al., Regulation of prostate cancer cell invasion by modulation of extra- and intracellular redox balance. Free Radic Biol Med. Jan. 15, 2012;52(2):452-61.

Danhier P, et al., Electron paramagnetic resonance: a powerful tool to support magnetic resonance imaging research. Contrast Media Mol Imaging. Nov. 2014;(May):n/a-n/a.

Deng Y, et al., Fast 3D spatial EPR imaging using spiral magnetic field gradient. J Magn Reson. Apr. 2007;185(2):283-90.

Deng Y, et al., Fast EPR imaging at 300 MHz using spinning magnetic field gradients. J Magn Reson. Jun. 2004;168(2):220-7.

Devasahayam N, et al. Strategies for improved temporal and spectral resolution in in vivo oximetric imaging using time-domain EPR. Magn Reson Med. Apr. 2007;57(4):776-83.

Devasahayam N, et al., Parallel coil resonators for time-domain radiofrequency electron paramagnetic resonance maging of biological objects. J Magn Reson. Jan. 2000;142(1):168-76.

Elajaili HB, et al., Electron spin relaxation times and rapid scan EPR imaging of pH-sensitive amino-substituted trityl radicals. Magn Reson Chem. England; Apr. 2015;53(4):280-284.

Enomoto A, et al., Four-channel surface coil array for 300-MHz pulsed EPR imaging: Proof-of-concept experiments. Magn Reson Med. Mar. 26, 2013;71(2):853-858.

Epel B, et al., A Versatile High Speed 250 MHz Pulse Imager for Biomedical Applications. Concepts Magn Reson Part B Magn Reson Eng. Jul. 10, 2008;33B(3):163-176.

Froncisz W, et al., The loop-gap resonator: a new microwave lumped circuit ESR sample structure. Journal of Magnetic Resonance (1969). 1982. p. 515-521.

Fujii H, et al. Mapping of redox status in a brain-disease mouse model by three-dimensional EPR imaging. Magn Reson Med. Jan. 2011;65(1):295-303.

Fujita H. New horizons in MR technology: RF coil designs and trends. Magn Reson Med Sci. 2007;6(1):29-42.

Gabriel C, et al., The dielectric properties of biological tissues: I. Literature survey. Phys Med Biol. 1996;41(11):2231-2249.

Gallez B, et al., In vivo EPR: when, how and why? NMR Biomed. Aug. 2004;17(5):223-5.

Geschewski FH, et al., Optimum coupling and multimode excitation of traveling-waves in a whole-body 9.4T scanner. Magn Reson Med. Jun. 2013;69(6):1805-12.

Hagen WR. Broadband Transmission EPR Spectroscopy. PLoS One. 2013;8.

Halpern HJ, et al., Diminished aqueous microviscosity of tumors in murine models measured with in vivo radiofrequency electron paramagnetic resonance. Cancer Res. Nov. 15, 1999;59(22):5836-5841.

He G, et al., Mapping of the B1 field distribution of a surface coil resonator using EPR imaging. Magn Reson Med. 2002;48(6):1057-1062.

He X, et al., Development and validation of an ex vivo electron paramagnetic resonance fingernail biodosimetric method. Radiat Prot Dosimetry. England; Jun. 2014;159(1-4):172-181.

Hoffmann J, et al., Human brain imaging at 9.4 T using a tunable patch antenna for transmission. Magn Reson Med. May 2013;69(5):1494-500.

Hyde JS, et al., W-band frequency-swept EPR. J Magn Reson. Jul. 2010;205(1):93-101.

Hyodo F, et al. Assessment of tissue redox status using metabolic responsive contrast agents and magnetic resonance imaging. J Pharm Pharmacol. Aug. 2008;60(8):1049-60.

Jang H, et al., A Method to Improve Temporal Resolution in EPR Imaging of Tissue Oxygenation. ISMRM Sci Exhib Meet. Salt Lake City, UT; 2013.

Jang H, et al., Single Acquisition Quantitative Single Point Electron Paramagnetic Resonance Imaging. Magn Reson Med. Aug. 1, 2013;70(4):1173-1181.

Jang H, et al., Accelerated Quantitative Single Point EPR Imaging Using Model-Based Compressed Sensing. ISMRM Sci Exhib Meet. Milan, Italy; 2014. p. 812.

Johnson DH, et al., Compressed sensing of spatial electron paramagnetic resonance imaging. Magn Reson Med. 2014;72(3):893-901.

Johnson DH, et al., Uniform spinning sampling gradient electron paramagnetic resonance imaging. Magn Reson Med. Mar. 8, 2013.

Jorgenson TC, et al., Redox imbalance and biochemical changes in cancer. Cancer Res. Oct. 15, 2013;73(20):6118-23.

Katscher U, et al., Parallel RF transmission in MRI. NMR in Biomedicine. 2006. p. 393-400.

Kleschyov AL, et al., Heparin-polynitroxides: synthesis and preliminary evaluation as cardiovascular EPR/MR imaging probes and extracellular space-targeted antioxidants. Eur J Med Chem. France; Dec. 2012;58:265-271.

Koscielniak J, et al., 300 MHz continuous wave electron paramagnetic resonance spectrometer for small animal in vivo Imaging. Rev Sci Instrum. 2000;71(11):4273.

Larkman DJ, et al., Use of multicoil arrays for separation of signal from multiple slices simultaneously excited. J Magn Reson Imaging. Mar. 2001;13(2):313-7.

Lund E, et al., EPR Imaging of Dose Distributions Aiming at Applications in Radiation Therapy. Radiat Prot Dosimetry. 2014;159(1):1-7.

Manzoor AA, et al., One-stop-shop tumor imaging: buy hypoxia, get lactate free. J Clin Invest. May 2008;118(5):1616-9.

Marignol L, et al., Hypoxia, notch signalling, and prostate cancer. Nat Rev Urol. Jul. 2013;10(7):405-13.

Matsumoto K, et al. Comparisons of EPR imaging and T1-weighted MRI for efficient imaging of nitroxyl contrast agents. J Magn Reson. Jul. 2007;187(1):155-62.

Matsumoto K, et al. Electron paramagnetic resonance imaging of tumor hypoxia: enhanced spatial and temporal resolution for in vivo pO2 determination. Magn Reson Med. May 2006;55(5):1157-63.

Matsumoto K, et al., Brain redox imaging. Methods Mol Biol. United States; Jan. 2011;711:397-419.

Matsumoto K-I, et al. High-resolution mapping of tumor redox status by magnetic resonance imaging using nitroxides as redox-sensitive contrast agents. Clin Cancer Res. Apr. 15, 2006;12(8):2455-62.

Matsumoto S, et al. Dynamic monitoring of localized tumor oxygenation changes using RF pulsed electron paramagnetic resonance in conscious mice. Magn Reson Med. Mar. 2008;59(3):619-25.

Matsumoto S, et al., Antiangiogenic agent sunitinib transiently increases tumor oxygenation and suppresses cycling hypoxia. Cancer Res. Oct. 15, 2011;71(20):6350-9.

McMillan A, et al., Optimal Partial Fourier Reconstructions in Electron Paramagnetic Resonance Imaging. ISMRM Sci Exhib Meet. Salt Lake City, UT; 2013.

(56) References Cited

OTHER PUBLICATIONS

Moeller S, et al., Multiband multislice GE-EPI at 7 tesla, with 16-fold acceleration using partial parallel imaging with application to high spatial and temporal whole-brain fMRI. Magn Reson Med. May 2010;63(5):1144-53.
Nacev A, et al., A Quiet, Fast, High-Resolution Desktop MRI Capable of Imaging Solids. ISMRM Sci Exhib Meet. Milan, Italy; 2014. p. 4833.
Ohliger MA, et al., An introduction to coil array design for parallel MRI. NMR in Biomedicine. 2006. p. 300-315.
Petryakov S, et al., Modified Alderman-Grant resonator with high-power stability for proton electron double resonance imaging. Magn Reson Med. Oct. 2006;56(3):654-9.
Petryakov S, et al., Segmented surface coil resonator for in vivo EPR applications at 1.1 GHz. J Magn Reson. 2009;198(1):8-14.
Plewes DB, et al., Physics of MRI: a primer. J Magn Reson Imaging. May 2012;35(5):1038-54.
Pollock JD, et al., Surface Loop Resonator Design for in Vivo Epr Tooth Dosimetry Using Finite Element Analysis. Health Phys. 2010;98(2):339.
Pursley RH, et al., Direct detection and time-locked subsampling applied to pulsed electron paramagnetic resonance imaging. Rev Sci Instrum. May 2005;76(3):1-6.
Pursley RH, et al., Stochastic excitation and Hadamard correlation spectroscopy with bandwidth extension in RF FT-EPR. J Magn Reson. 2003;162(1):35-45.
Quine RW, et al., A pulsed and continuous wave 250 MHz electron paramagnetic resonance spectrometer. Concepts Magn Reson. Mar. 13, 2002;15(1):59-91.
Rigla JP, et al., Design and Additive Manufacturing of MRI Gradient Coils. IEEE Nucl Sci Symp Med Imaging Conf. Seattle, WA; 2014. p. M19-110.
Rinard GA, et al., 250 MHz crossed-loop resonator for pulsed electron paramagnetic resonance. Concepts Magn Reson. Mar. 13, 2002;15(1):37-46.
Rinard GA, et al., A Wire Crossed-Loop-Resonator for Rapid Scan EPR. Concepts Magn Reson Part B Magn Reson Eng. Apr. 9, 2010;37B(2):86-91.
Rinard GA, et al., Magnet and gradient coil system for low-field EPR imaging. Concepts Magn Reson. Wiley Online Library; 2002;15(1):51-58.
Samouilov A, et al., Development of a hybrid EPR/NMR coimaging system. Magn Reson Med. 2007;58:156-166.
Sathiya M, et al., Electron paramagnetic resonance imaging for real-time monitoring of Li-ion batteries. Nat Commun. England; 2015;6:6276.
Sawicki JF, et al., The impact of frequency on the performance of microwave ablation. Int J Hyperthermia. Jul. 21, 2016;1-8.
Shellock FG. Radiofrequency energy-induced heating during MR procedures: A review. Journal of Magnetic Resonance Imaging. 2000. p. 30-36.
Sodickson DK, et al., Recent advances in image reconstruction, coil sensitivity calibration, and coil array design for SMASH and generalized parallel MRI. Magn Reson Mater Physics, Biol Med. 2002. p. 158-163.
Sotgiu A, et al., pH-sensitive imaging by low-frequency EPR: a model study for biological applications. Phys Med Biol. England; Jul. 1998;43(7):1921-1930.
Soule BP, et al. The chemistry and biology of nitroxide compounds. Free Radic Biol Med. Jun. 1, 2007;42(11):1632-50.
Stewart GD, et al. The relevance of a hypoxic tumour microenvironment in prostate cancer. BJU Int. Jan. 2010;105(1):8-13.
Subramanian S, et al., A new strategy for fast radiofrequency CW EPR imaging: direct detection with rapid scan and rotating gradients. J Magn Reson. Jun. 2007;186(2):212-9.
Subramanian S, et al., Dancing With the Electrons: Time-Domain and Cw in Vivo Epr Imaging. Magn Reson Insights. Sep. 24, 2008;2(301):43-74.
Subramanian S, et al., Radio frequency continuous-wave and time-domain EPR imaging and Overhauser-enhanced magnetic resonance imaging of small animals: instrumental developments and comparison of relative merits for functional imaging. NMR Biomed. Aug. 2004;17(5):263-94.
Subramanian S, et al., Single-point (constant-time) imaging in radiofrequency Fourier transform electron paramagnetic resonance. Magn Reson Med. Aug. 2002;48(2):370-9.
Subramanian S, et al., Evaluation of partial k-space strategies to speed up time-domain EPR imaging. Magn Reson Med. Oct. 8, 2012;70:745-753.
Sundramoorthy S V, et al., Orthogonal resonators for pulse in vivo electron paramagnetic imaging at 250 MHz. J Magn Reson. Mar. 2014;240:45-51.
Swartz HM, et al., Clinical EPR. Unique Opportunities and Some Challenges. Academic Radiology. 2014. p. 197-206.
Swartz HM, et al., Overview of the principles and practice of biodosimetry. Radiat Environ Biophys. Germany; May 2014;53(2):221-232.
Tseitlin M, et al., Corrections for sinusoidal background and non-orthogonality of signal channels in sinusoidal rapid magnetic field scans. J Magn Reson. Oct. 2012;223:80-4.
Tseitlin M, et al., Deconvolution of sinusoidal rapid EPR scans. J Magn Reson. 2011;208(2):279-283.
Tseitlin M, et al., Digital EPR with an arbitrary waveform generator and direct detection at the carrier frequency. J Magn Reson. Dec. 2011;213(1):119-25.
Tseitlin M, et al., Rapid frequency scan EPR. J Magn Reson. Elsevier Inc.; 2011;211(2)156-161.
Tseitlin M, et al., New spectral-spatial imaging algorithm for full EPR spectra of multiline nitroxides and pH sensitive trityl radicals. J Magn Reson. United States; Aug. 2014;245:150-155.
Ugurbil K. Magnetic resonance imaging at ultrahigh fields. IEEE Trans Biomed Eng. 2014;61(5):1364-1379.
Webb AG, et al., MRI and localized proton spectroscopy in human leg muscle at 7 Tesla using longitudinal traveling waves. Magn Reson Med. Feb. 2010;63(2):297-302.
Wright GA. Magnetic resonance imaging. IEEE Signal Process Mag. 1997;14(1):56-66.
Wright GA. Signal acquisition and processing for magnetic resonance imaging. Proc 1st Int Conf Image Process. IEEE Comput. Soc. Press; p. 523-527. 1994.
Yamada K-I, et al., Evaluation and comparison of pulsed and continuous wave radiofrequency electron paramagnetic resonance techniques for in vivo detection and imaging of free radicals. J Magn Reson. Feb. 2002;154(2):287-97.
Yang QX, et al., Analysis of wave behavior in lossy dielectric samples at high field. Magn Reson Med. 2002;47(5):982-989.
Yasui H, et al. Low-field magnetic resonance imaging to visualize chronic and cycling hypoxia in tumor-bearing mice. Cancer Res. Aug. 15, 2010;70(16):6427-36.
Zhelev Z, et al. Tissue redox activity as a sensing platform for imaging of cancer based on nitroxide redox cycle. Eur J Cancer. Apr. 2013;49(6):1467-78.
Zhelev Z, et al., Imaging of superoxide generation in the dopaminergic area of the brain in Parkinson's disease, using mito-TEMPO. ACS Chem Neurosci. United States; Nov. 2013;4(11):1439-1445.
Zhu Y. Parallel excitation with an array of transmit coils. Magn Reson Med. Apr. 2004;51(4):775-84.

* cited by examiner

SYSTEM AND METHOD FOR ELECTRON PARAMAGNETIC RESONANCE IMAGING USING TRANSMISSION LINES TO GENERATE TRAVELING WAVES

STATEMENT REGARDING FEDERALLY SPONSORED RESEARCH

This invention was made with government support under TR000427 awarded by the National Institutes of Health. The government has certain rights in the invention.

BACKGROUND

The present disclosure relates to systems and methods for medical imaging. More particularly, the present disclosure relates to systems and method for electron paramagnetic resonance imaging (EPRI) using a traveling wave regime to generate electromagnetic fields.

Electron paramagnetic resonance imaging (EPRI) is a low-cost and highly-specific molecular imaging modality. Molecular imaging describes biomedical imaging techniques that derive specific contrast based on the molecular biology of the associated tissue being assessed, and is most often associated with positron emission tomography (PET). EPRI can also be used to non-invasively measure tissue properties such as oxygenation, pH, and redox status and has additional demonstrated applications in cell tracking, radiation dosimetry, and non-biological applications in materials science. Compared to other imaging modalities that utilize response to magnetic fields as a mechanism to elicit contrast, such as magnetic resonance imaging (MRI), EPRI requires substantially lower magnetic fields, allowing the use of non-superconducting electromagnetics, which substantially reduce construction and siting costs. Thus, in many ways, EPRI is more flexible, less costly, and less complex than popular clinical modalities for molecular imaging, such as PET, or anatomical imaging, such as MRI.

Despite these advantages, EPRI has often been limited to small-animal imaging. The two primary reasons for this limitation against extending EPRI to clinical medicine are (1) the short signal lifetimes encountered in EPRI, which make image acquisition technologically challenging, and (2) the need to use higher RF/microwave frequencies to achieve the desired sensitivity, which can be challenging in terms of uniform magnetic field creation, tissue penetration for whole-body or large volume imaging, and power absorption within the tissue. While several solutions to image acquisition challenges relative to short signal lifetimes have been demonstrated, the remaining limitation of moving toward higher frequency operation for imaging is unmet, yet critical to making EPRI available for clinical, human applications.

Thus, a need persists to allow provide imaging systems and methods that can leverage the electron paramagnetic resonance phenomenon for imaging in clinical, human settings.

SUMMARY

The present disclosure overcomes the aforementioned drawbacks providing systems and methods for electron paramagnet resonance imaging (EPRI) that depart from traditional magnetic-field-generation systems in favor of antennas and magnetic field generators operating in a traveling wave regime that improves the uniformity of RF penetration through tissue without falling prey to the limitations of traditional systems.

In accordance with one aspect of the disclosure, an electron paramagnetic resonance imaging (EPRI) system is provided. The system includes a magnet configured to apply a static magnetic field to a subject to be imaged and a gradient coil configured to apply a magnetic field gradient to the static magnetic field. The system also includes a transmission line configured to use a traveling wave to generate a radio frequency (RF) magnetic field over a volume of interest (VOI) in the subject to elicit EPRI data from the VOI and a processor configured to reconstruct the EPRI data into an image of the VOI.

In accordance with another aspect of the disclosure, an electron paramagnetic resonance imaging (EPRI) system is provided that includes a magnet configured to apply a static magnetic field to a subject to be imaged and a gradient coil configured to apply a magnetic field gradient to the static magnetic field. The system also includes a parallel plate waveguide (PPWG) configured to use a traveling wave to generate a radio frequency (RF) magnetic field over a volume of interest (VOI) in the subject to elicit EPRI data from the VOI and a processor configured to reconstruct the EPRI data into an image of the VOI.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1A:
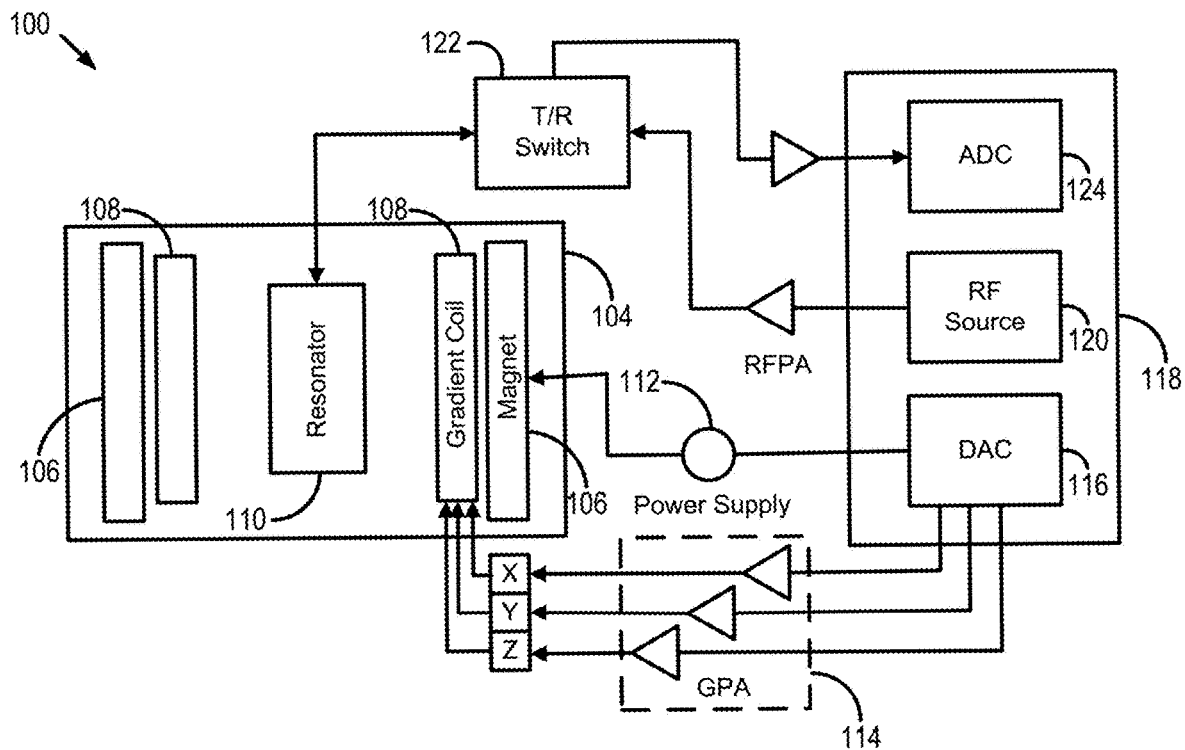
FIG. 1A is a block diagram of an electron paramagnetic resonance imaging (EPRI) system.

Electron paramagnetic resonance imaging (EPRI) works on the same principles of physics as magnetic resonance imaging, except that the species of interest is the electron, rather than the proton or other magnetic nuclei. These techniques rely on the resonant properties of unpaired electrons and certain atomic nuclei (e.g., 1H, 13C, 14N, 19F, 23Na, 31P) in the presence of a uniform magnetic field. For example, the electron (with spin quantum number=½) aligns itself either parallel or anti-parallel to the applied magnetic field. The energy of these two states is described by the Zeeman Effect. The electron may then transition between these two states by emitting or releasing a photon, which has an energy matching the energy difference between the two states, thereby providing a frequency dependence or resonance condition to all transitions. This frequency dependence scales linearly with the applied magnetic field and, therefore, the theoretical signal available also scales linearly with the applied magnetic field. Thus, EPRI at higher operating frequencies allow inherently more sensitive imaging.

Extending beyond the isolated electron, an electron in nature interacts with its local molecular environment, causing not just small changes in the levels, but splitting into additional energy levels (e.g., hyperfine coupling). Fortuitously, these energy level changes form a "fingerprint" of the electron and its environment, which can be used to characterize materials with high specificity. Measuring these signatures forms the basis of electron spin resonance or electron paramagnetic resonance (ESR or EPR). The extension of these spectroscopic methods to imaging is analogous to extending nuclear magnetic resonance (NMR) into MRI.

The EPRI signal is dependent upon the concentration of unpaired electrons (or free radicals), and these species are not typically endogenously present in large numbers in most materials and living tissues. Analogous to the concept of exogenous tracers that are routinely used for positron emission tomography (PET) imaging, (where the ionizing radiation of decaying radioactive molecules is used to generate images with highly specific molecular contrast) many non-ionizing biomedical imaging agents (some stable, some unstable) have been developed for use in the EPRI applications summarized in Table 1.

TABLE 1

Noted applications of electron paramagnetic resonance and electron paramagnetic resonance imaging.

| | |
|---|---|
| Oxygenation[1-8] | Redox status[9-15, 25-30] |
| pH[31-35] | Microviscosity[36-39] |
| Cell tracking[40-42] | Dosimetry[43-45] |
| Materials science[46, 47] | |

The two most common applications of EPRI are the in vivo assessment of tissue oxygenation (hypoxia) and tissue redox status, both of which are highly relevant in analysis of cancer, as well as in stroke, heart disease, and ischemic limb disease. Other non-cancer applications have focused on the investigation of oxidative stress and redox status. EPRI agents have been developed to perform non-invasive imaging of pH, which also has roles in cancer investigations (and is related to redox status), but also in drug delivery investigations. Another role in drug delivery studies is the use of EPRI agents to study microviscosity. EPRI can be utilized in cell tracking and migration studies. An additional particularly-high-impact application includes spectroscopic evaluation and imaging of ionizing radiation dose (dosimetry), which can be performed without an exogenous tracer. Finally, EPRI has been demonstrated non-biomedically, to evaluate materials, such as lithium ion batteries and solar cells.

Despite these advantageous aspects of EPRI, EPRI is not currently used clinically in humans, and in vivo demonstrations have, thus far, been limited to small animal models.

While efforts to bring this technology to the clinic are ongoing, there are a variety of fundamental limitations to the current development of EPRI systems that keep it from clinical, human or veterinary use. That is, there are significant technical factors that both benefit and complicate the implementation of EPRI for clinical uses including humans.

For example, the extremely rapid spin-spin relaxation of the imaged agents ($T2^*<10$ μs for trityl agents [typically used for oximetric applications], $T2^*<500$ ns for nitroxide agents [typically used for redox applications]) makes encoding methods that are ubiquitous in MRI difficult or impossible (e.g., slice selective excitation and frequency encoding). Thus, due to the fleeting signal, EPRI is best performed under constant or slowly varying gradients (e.g., using continuous wave or single point pulsed techniques), which greatly slows the rate of image acquisition, typically beyond clinically-reasonable times. To overcome this limitation, many recent developments have been proposed to accelerate image acquisition using acquisition acceleration techniques.

Even if acquisition times are brought into acceptable lengths for human clinical or veterinary use, the high gyromagnetic ratio of the electron (~660× greater than the proton nuclei used in MRI), which increases the polarization (Boltzmann distribution), increases the potential measureable signal and sensitivity of the modality, but requires extremely-high electron spin bandwidths and complicates RF coil design. Favorably, this also allows EPRI to be performed at significantly lower magnetic fields than MRI. Most in vivo EPRI systems operate between 0.0089-0.0107 T, which allows the use of an easy-to-site and low-cost resistive electromagnets, as opposed to superconducting magnets in MRI. This high gyromagnetic ratio, whilst improving sensitivity and reducing hardware costs (e.g. through the use resistive electromagnets compared to superconducting magnets used in MRI), equates to higher frequency operation (e.g., a 0.0107 T EPRI scanner operates with the same radiofrequency requirements as a 7T MRI scanner). Because imaging is performed using magnetic field gradients, the electron spin bandwidth, or spread of frequencies along the applied gradient direction can also be extremely high (10-100 MHz). This complicates the design of the RF sub-systems, requiring fundamental deviations from concepts used in MRI. RF coil bandwidth is typically addressed by the use of extremely rapid (<100 ns) high bandwidth RF pulses or, for continuous wave imaging, sweep coils to modulate the local magnetic field, rather than using a frequency swept pulse, as used in NMR.

A third technical factor complicating the adaptation of EPRI for veterinary or clinical human use is the increased amount of energy absorbed by tissues at higher operating frequencies (i.e. the specific absorption rate (SAR)). If not properly accounted for, tissue heating can become excessive and potentially dangerous, particularly, for poorly perfused tissues. This issue is inevitably encountered in EPRI (particularly using pulsed acquisition strategies), as well as ultra-high-field MRI (field strength>7T). Some have developed stochastic excitation techniques to reduce SAR.

Finally, increased operating frequency reduces the distance RF energy penetrates into tissue, which is referred to as "skin depth". This problem is particularly exacerbated in EPRI systems that use the reactive near-fields of RF resonators for imaging. In these systems, the tissue to be imaged is located in the near field region of the resonator. In the reactive near field region of a resonator, the field strength decays much more rapidly as frequency increases compared to the far field of an antenna (e.g. $e^{-\alpha r}/(kr)^n$, $2<n<3$, magnitude reduction in the near field vs. $e^{-\alpha r}/kr$ reduction in the far field). Thus, at high frequencies, a conventional resonator-based EPRI system cannot provide a uniform magnetic field distribution across the imaging area. This results in objectionable shading or complete loss of signal in acquired images. While this does not pose significant problems for highly localized surface imaging or imaging of small animals such as mice, this is the most significant hurdle for human or veterinary use of EPRI.

Ultra-high-field MRI also experiences these issues, and techniques such as parallel transmit (which utilizes multiple simultaneous RF elements), can be used to improve RF uniformity (and also reduce SAR). Such techniques have not yet been fully proposed or developed for EPRI, likely due to the complication of making an array from the shielded RF coil designs that are frequently utilized for EPRI, as well as the substantial cost of making parallel transmit systems due to the need for multiple RF amplifiers (which are extremely expensive since pulse timing requirements in EPRI require timing that is at least 3 orders of magnitude shorter than MRI).

As will be described herein, the systems and methods of the present disclosure overcome these and other challenges by providing systems and methods for EPRI that use traveling waves (TW). In accordance with the present disclosure, a transmission line may be used to create a uniform magnetic field distribution over a large section of a volume of interest (VOI), even on the scale of ROIs within a human. Within the transmission line, the magnitude of the RF magnetic field remains constant (i.e., no $1/(kr)^n$ decay). This drastically reduces the field decay problems experienced in resonator-based EPRI.

As a result, when operating at higher frequencies, one can still provide a uniform magnetic field distribution over substantial VOIs inside the human body or in veterinary applications. As will be described, the TW EPRI systems and methods of the present disclosure allow the use of a higher magnetic field to improve sensitivity for a benchtop TW EPRI systems field size and consistency needed to implement human-sized or veterinary EPRI techniques.

Figure 1B:
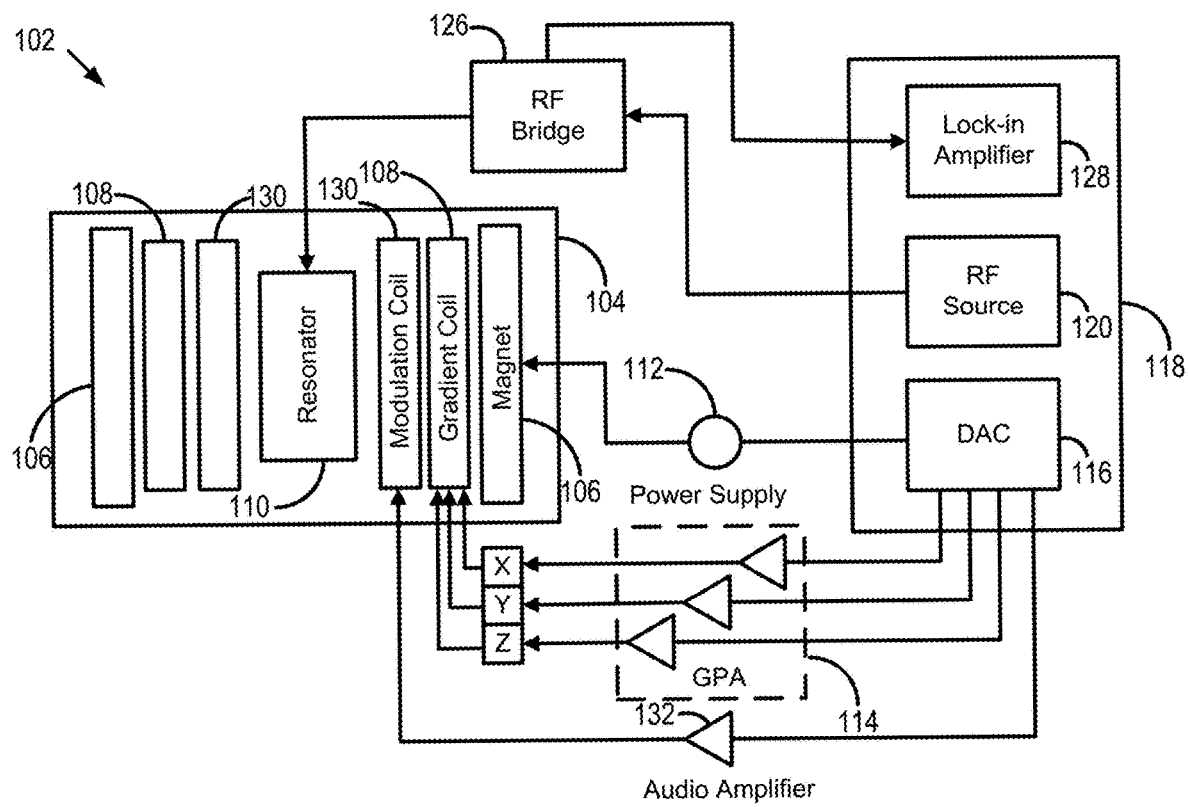
FIG. 1B is a block diagram of another EPRI system.

Traditionally, the design of EPRI systems have been highly analogous to NMR and MRI system designs. As a result of this, two distinct designs of EPRI systems have been developed. Referring to FIG. 1A a first EPRI system is illustrated that utilizes broadband RF pulses (i.e., the pulsed approach). As shown in FIG. 1B, a second EPRI system is illustrated that utilizes continuous wave (CW) RF energy to detect the reflected energy from unpaired electrons (i.e., the CW approach).

The pulsed approach utilizing the system of FIG. 1A is particularly challenging to develop due to bandwidth considerations, as described above, and due to the short-lived EPRI signals. For example, switching between transmit mode (at several hundreds of Watts) and receive (to measure nano-volt level signals) takes several hundred nanoseconds during which up to 50% of the available signal may be lost due to endogenous signal decay given the short spin-spin relaxation rates (T2*) encountered in EPRI. Furthermore, pulsed EPRI is currently limited only to compounds that have sufficiently long signal lifetimes (e.g., the trityl radical oximetry agents) whereas other components are extremely difficult or impossible to detect (e.g., the nitroxides used for redox imaging). On the other hand, the CW approach utilizing the system of FIG. 1B has been traditionally limited by acquisition speed, but this limitation has decreased with the development of so-called "rapid-scan methods." Regardless of these shortcomings, both methods have been demonstrated for successful biomedical imaging applications.

The designs of the systems illustrated in FIGS. 1A and 1B are highly similar, and a given system can be adapted from type to the other with only a few component changes. In particular, both the pulsed EPRI system 100 of FIG. 1A and the CW EPRI system 102 of FIG. 1B include an imaging system 104 including a magnet 106, a gradient coil system 108, and a resonator 110. The magnet 106 is comparatively small, for example, when considering MRI. For example, the magnet 106 is less than 1 Tesla (T) and often in the rate of a few mT, such as 4 mT. In this way the magnet 106 is driven by a power supply 112 and the gradient coil system 108 is drive by gradient power amplifiers 114, which are both controlled by DAC 116 that forms part of a control system 118. Also included in the control system 118 is an RF source 120 that drives the resonator 110.

Resonators that are currently used for in vivo EPRI of small animals are typically limited in coverage to a small section of the body. A variety of designs exist, but most commonly use surface loop resonators, loop-gap resonators, parallel resonators, or the like. Among the limitations of using conventional resonators is their limited sensing volumes and incapability to generate uniform magnetic field distribution over large volumes at high frequencies. This is primarily due to the fact that these resonators use reactive near fields for imaging. Thus, a uniform RF magnetic field can be generated only in a small volume in the center of the coil. At higher frequencies, the problem with the sensing volume of these resonators is further exacerbated due to the reduced penetration depth of RF fields into biological tissues (note that in conventional EPRI resonators are often used for both transmit and receive). However, as will be described, the TW EPRI systems and methods of the present disclosure are not limited in this manner and allows for increasing the system sensitivity by using higher operating frequencies, while providing a more spatially uniform RF field illumination and penetration within larger objects.

The systems 100, 102 differ in the use of a transmit/receive switch 122 in the pulsed EPRI system 100 of FIG. 1A that enables fast switching between the RF source 120 and an analog-to-digital (ADC) converter 124. This is distinguished from the CW EPRI system 102 that utilizes an RF bridge 126 to couple the resonator 110 to the RF source 120 or a lock-in amplifier 128. Also, the CW EPRI system 102 includes a modulation coil 130 coupled through an audio amplifier 132 to the DAC 116.

With this in mind, the systems and methods described herein are provided relative to operating in a CW regime due to the increased cost, RF power requirements, and RF bandwidth limitations of the pulsed imaging system. However, such descriptions are non-limiting. The TW EPRI systems and method described herein are readily applicable to being used with either pulsed or CW systems or methods.

Regardless of the particular system architecture utilized, gradient encoding in EPRI is analogous to the techniques used in MRI to generate images. For example, EPRI gradient encoding is particularly similar to the ultrashort time echo (UTE) acquisitions utilized in MRI. However, there are two primary differences between the techniques that are used in EPRI versus MRI. First, due to the significantly higher gyromagnetic ratio of the electron compared to the proton as described above, the peak gradient amplitudes needed for imaging are thus concordantly lower. This ameliorates some of the hardware design challenges for gradient encoding as lower amplitude gradients are required for imaging an object of the same size. Second, imaging gradients in EPRI are generally not feasibly manipulated within each repetition of the data acquisition period, as is routine for MRI. While this is expected for acquisitions in the CW regime, the pulsed EPRI regime is fundamentally limited by the short lifetime of the EPR signal such that it is impractical to slew gradient fields within these time constraints. However, encoding schemes that use tomographic back projection reconstruction Fourier transform, Cartesian Fourier-encoded, and hybrid techniques have been successfully implemented.

Figure 2:
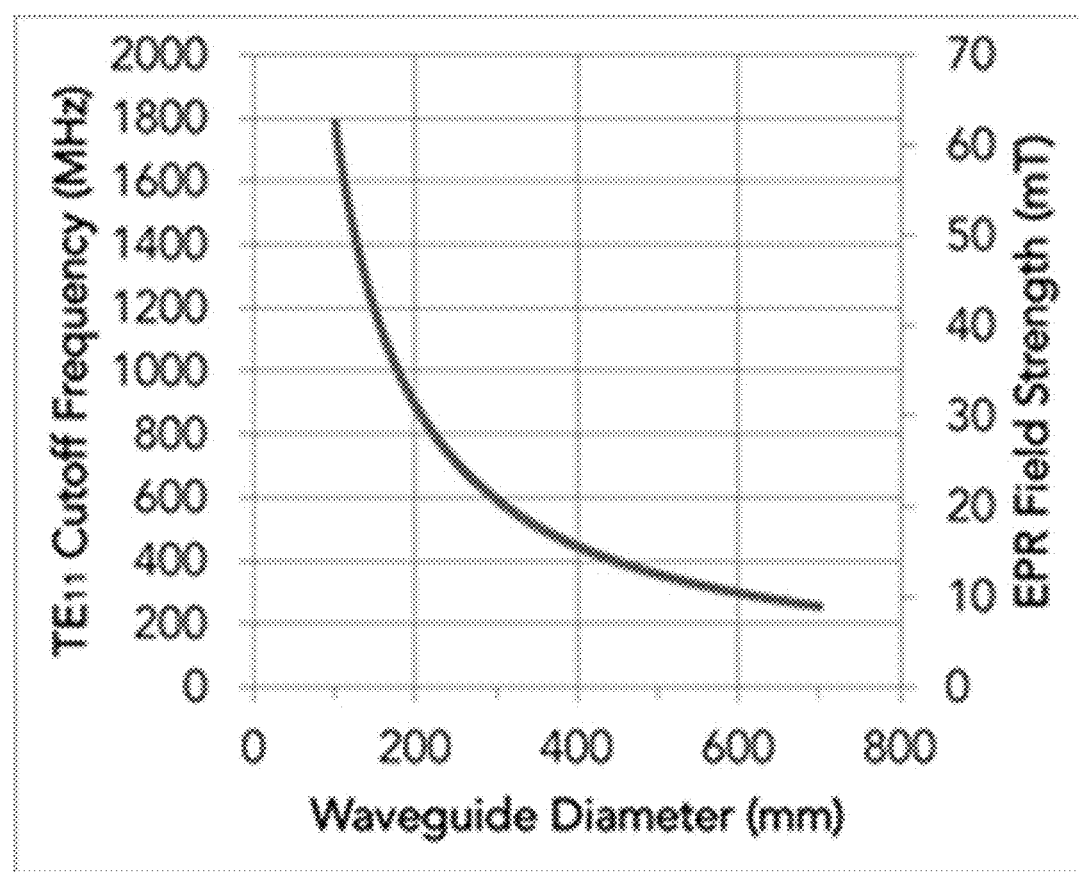
FIG. 2 is a graph showing E11 cutoff frequency (and EPR field strength) vs. waveguide diameter.

The present disclosure recognizes that in EPRI, due to the reduced static magnetic field strength requirements and the use of a resistive electromagnet, where the magnet field (and thus EPRI frequency) can be readily adjusted by a programmable power supply, a TW approach can be implemented with great flexibility. That is, the present disclosure recognizes that the EPRI frequency can be adjusted to match the $TE_{11}$ mode given by the diameter of the waveguide, as shown in FIG. 2. The TW EPRI systems and methods provided herein simplify overall system design, reduce system cost, and expand imaging capability by improving RF transmission to allow the use of higher magnetic field strengths for improved sensitivity.

Figure 3A:
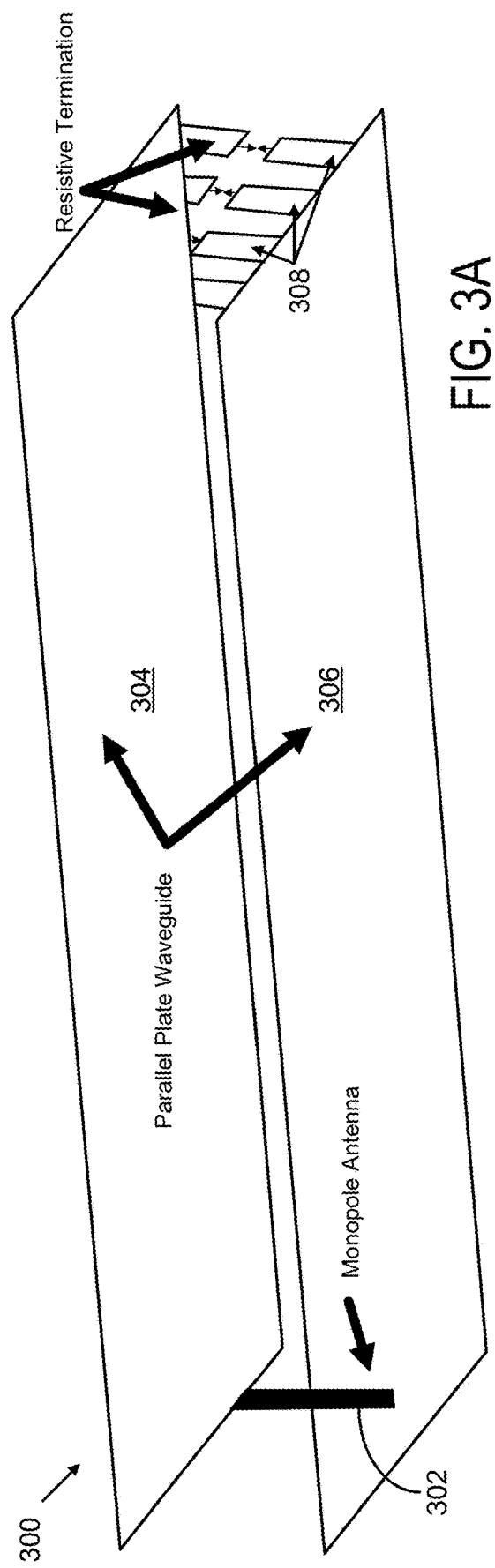
FIG. 3A is a perspective view of a parallel plate waveguide fed by a monopole antenna in accordance with the present disclosure.
Figure 3B:
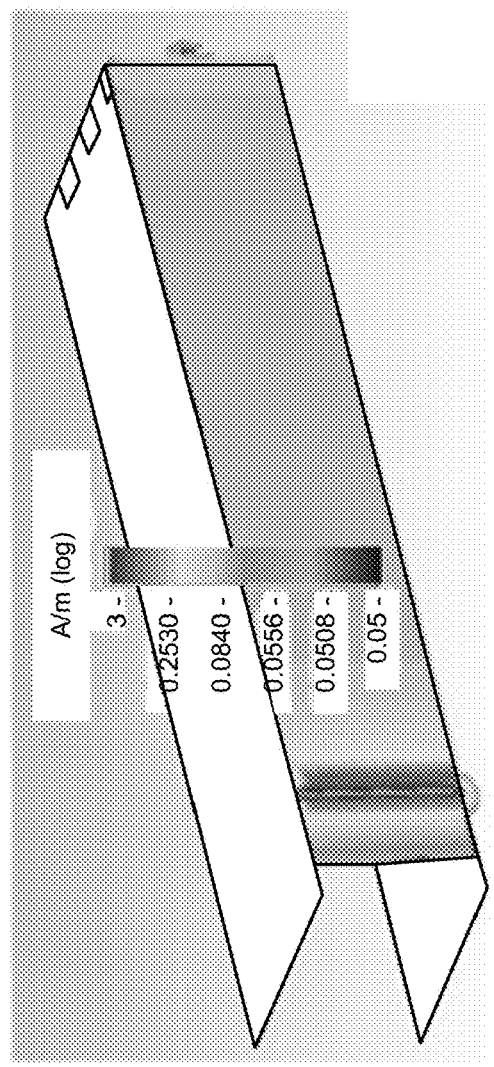
FIG. 3B is a cut-plane view of a simulated magnetic field generated with the parallel plate waveguide of FIG. 3A.

The systems of FIGS. 1A and 1B can be adapted in accordance with the present disclosure to include a parallel plate waveguide. Specifically, referring to FIG. 3A, a parallel plate waveguide (PPWG) 300 for an EPRI system is illustrated that can be used to adapt the systems of FIG. 1A or 1B to function as a TW EPRI system. In particular, the PPWG 300 is formed from a monopole antenna 302 between first and second plates 304, 306 that form the PPWG 300 and extend to resistive terminations 308. To create a TW excitation, a uniform magnetic field was created along the length of the PPWG 300 across a large volume, as illustrated in FIG. 3B.

Figure 4:
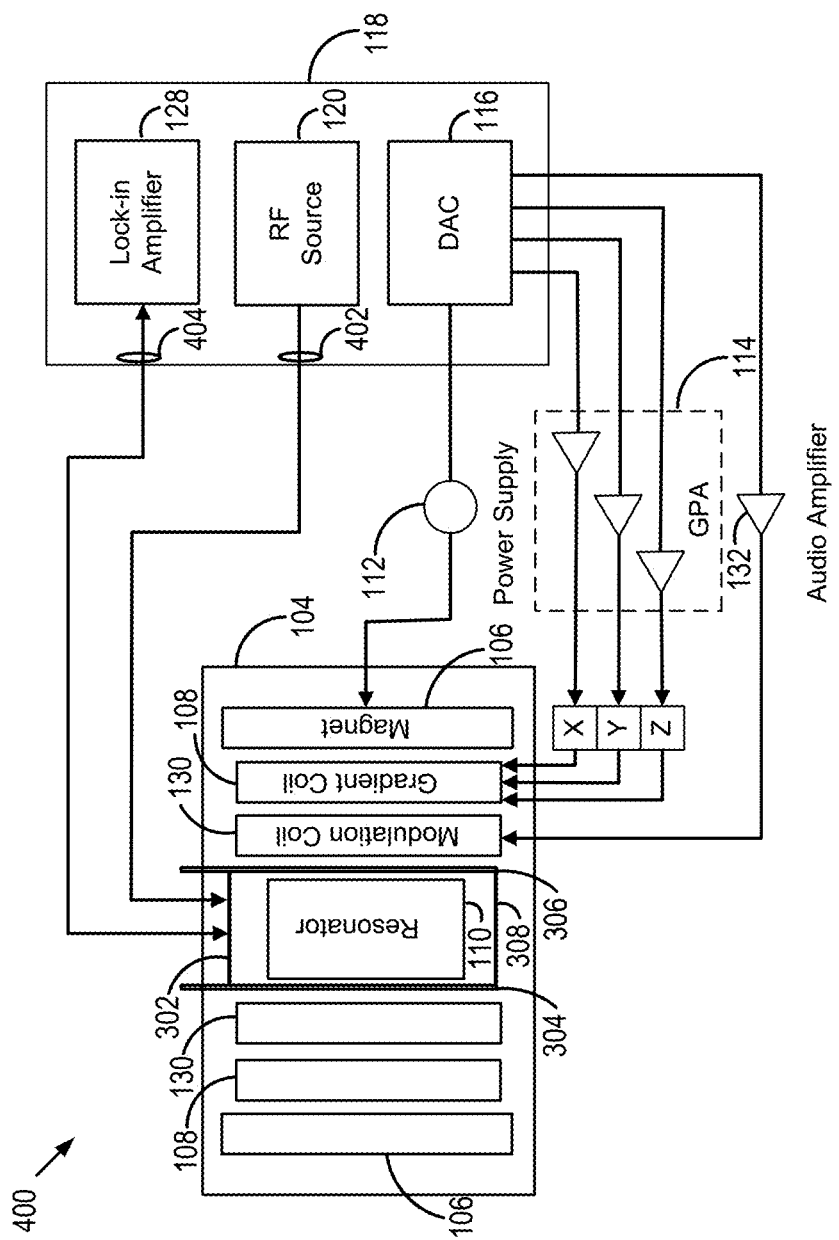
FIG. 4 is a block diagram of an EPRI system in accordance with the present disclosure incorporating the parallel plate waveguide of FIG. 3A.

The PPWG 300 is a substantial departure from a conventional, reflection-type EPR excitation systems. However, to use the PPWG 300 in a full EPRI system, the RF bridge 126 of FIG. 1B can simply be replaced with a much-simpler direct feed of the monopole antenna 302 from the RF source 120, meaning that no hybrid junction is required. As illustrated in FIG. 4, in this case, the EPRI system 400 in accordance with the present disclosure can be realized when the resonator 110 of FIG. 1A or 1B is utilized as a receiver in a two-port configuration, where a transmitter port 402 of the control system 118 is connected to the input of the monopole antenna 302 and a receive port 404 of the control system 118 is connected to the use the resonator 110 as a receiver coil. This architecture, illustrated in FIG. 4, implements a transmission-type system where the RF magnetic field required for EPRI excitation is created by the transmission line 304, 306 and the monopole antenna 302. The resonator 110 is used only for receiving. Thus, a uniform magnetic field is created over an entire volume of interest (VOI) that can be large, such as to include human or veterinary imaging.

The system 400 of FIG. 4 is in sharp contrast to conventional reflection-type continuous wave EPR imaging or spectrometry systems, where the resonator is used both as the transmitter and the receiver and, as such, are not able to provide a uniform RF magnetic field distribution over the entire volume of the sample. The systems and methods provided herein enable imaging at much higher magnetic field strengths (and thus higher frequencies) than currently used, such as 1 GHz vs. 250-300 MHz, at a size that is suitable for human or veterinary imaging. Thus, the systems and methods provided herein provide for the use of EPRI for in vivo human or veterinary imaging applications.

In one non-limiting example, a prototype PPWG was constructed form two 26 gauge brass sheets of size 9.4×4.7 cm. Nylon plastic screws and bolts were used to separate the plates by 6 cm. Using a monopole antenna to realize a TW excitation, simulation results demonstrated the creation of a uniform magnetic field along the length of the PPWG, as illustrated in FIG. 3b, across a large volume. The other end of the transmission line was resistively terminated at the characteristic impedance of the waveguide to ensure that the wave launched by the antenna along the transmission line was indeed a traveling wave and reflections at the far end did not create a standing wave pattern and distort the uniformity of the magnetic field.

In use, as described above, the RF bridge of an EPRI system was replaced with a direct feed of the monopole antenna (e.g., no hybrid junction), a new modulation coil was printed and constructed to fit inside the waveguide, and the existing resonator was used as the receiver in a two-port configuration where port 1 (transmitter) was connected to the input of the monopole antenna and where port 2 was connected to the receive resonator/coil. In this transmission-type measurement system, the RF magnetic field required for EPR excitation was created by the transmission line and the monopole antenna. The resonator was used only for receiving. As a result, a uniform magnetic field was created over the entire volume of the sample.

Figure 5B:
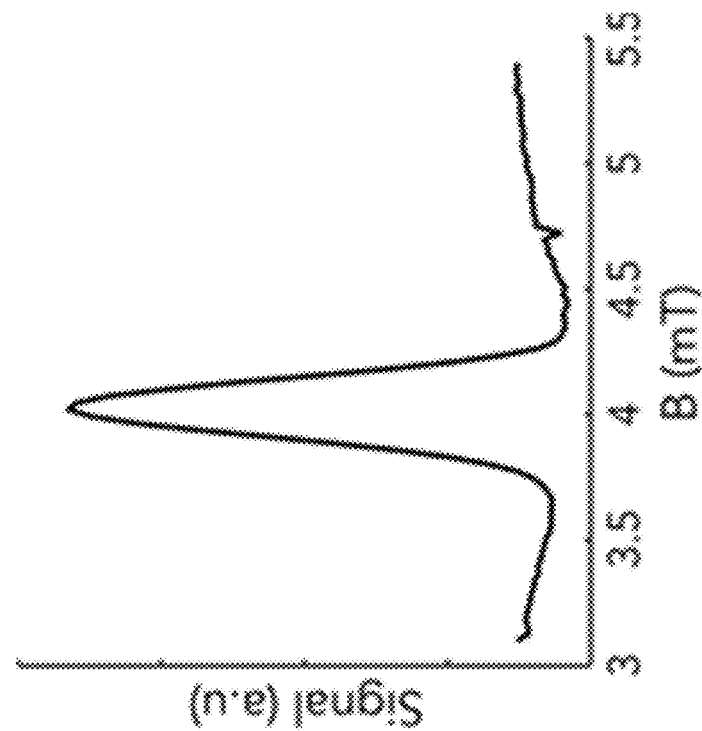
FIG. 5B is a graph of measured spectrum (first derivative of absorbance) of 1,1-diphenyl-2-picrylhydrazyl (DPPH) on the traveling wave spectrometer adapted within the system of FIG. 4.
Figure 5A:
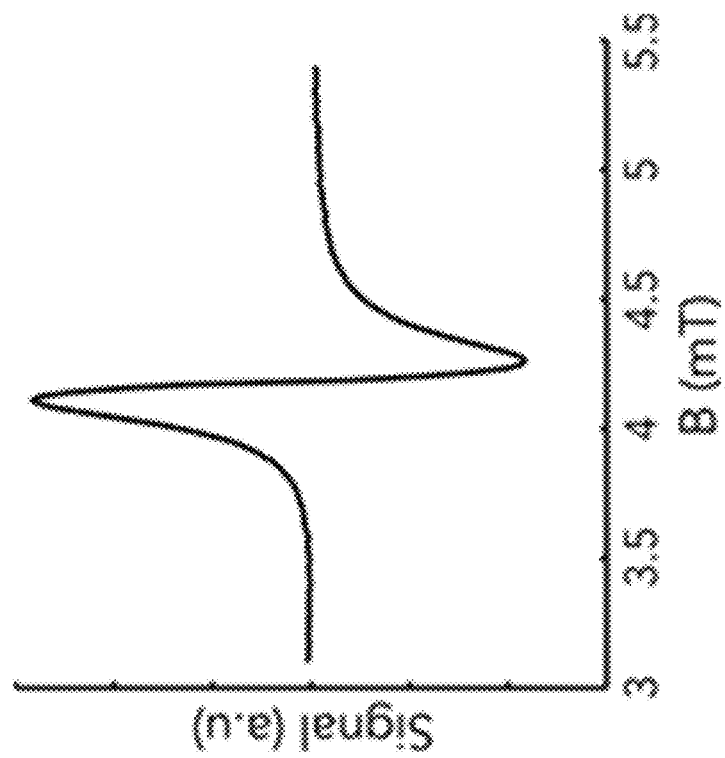
FIG. 5A is a graph of measured spectrum (absorbance) of 1,1-diphenyl-2-picrylhydrazyl (DPPH) on a prototype traveling wave spectrometer in accordance with the present disclosure.

The results of the above-described system were compared to a traditional system where the resonator was used both as the transmitter and the receiver and as such was not able to provide a uniform RF magnetic field distribution over the entire volume of the sample. Specifically, FIG. 5A provides a graph of a measured spectrum (first derivative of absorbance) of 1,1-diphenyl-2-picrylhydrazyl (DPPH) acquired using a traditional EPR system. On the other hand, the measured spectrum of DPPH on the TW EPR system described above is shown in FIG. 5B. Note that the spectrum in FIG. 5B does not represent the first derivative of the absorption signal which seen in FIG. 5A, and common in conventional reflection-based CW spectrometers, because in the two port system, the lock-in detection does not measure the signal around a null point ($S_{11}$), rather a local maximum ($S_{21}$). Also, the TW EPR operating mode improves the sensitivity of the EPR system compared to the reflection-mode designs.

While the above-described PPWG is advantageous for the creation of transmission lines supporting the transverse electromagnetic (TEM) waves, other two conductor waveguides can also be used. For example, two conductor lines with semi-cylindrical conductors may be used. Also, the devices may be operated at higher frequencies and the antennas may be adapted for exciting the TW within the waveguide as well as for detecting the EPR signal, without relying on a resonator, as described above.

The TW EPRI system described above and illustrated in FIG. 4 can be used in a combined configuration with a traditional EPRI system that can switch between traditional EPR imaging or spectroscopy operation and TW EPR imaging or spectroscopy operation.

Figure 6:
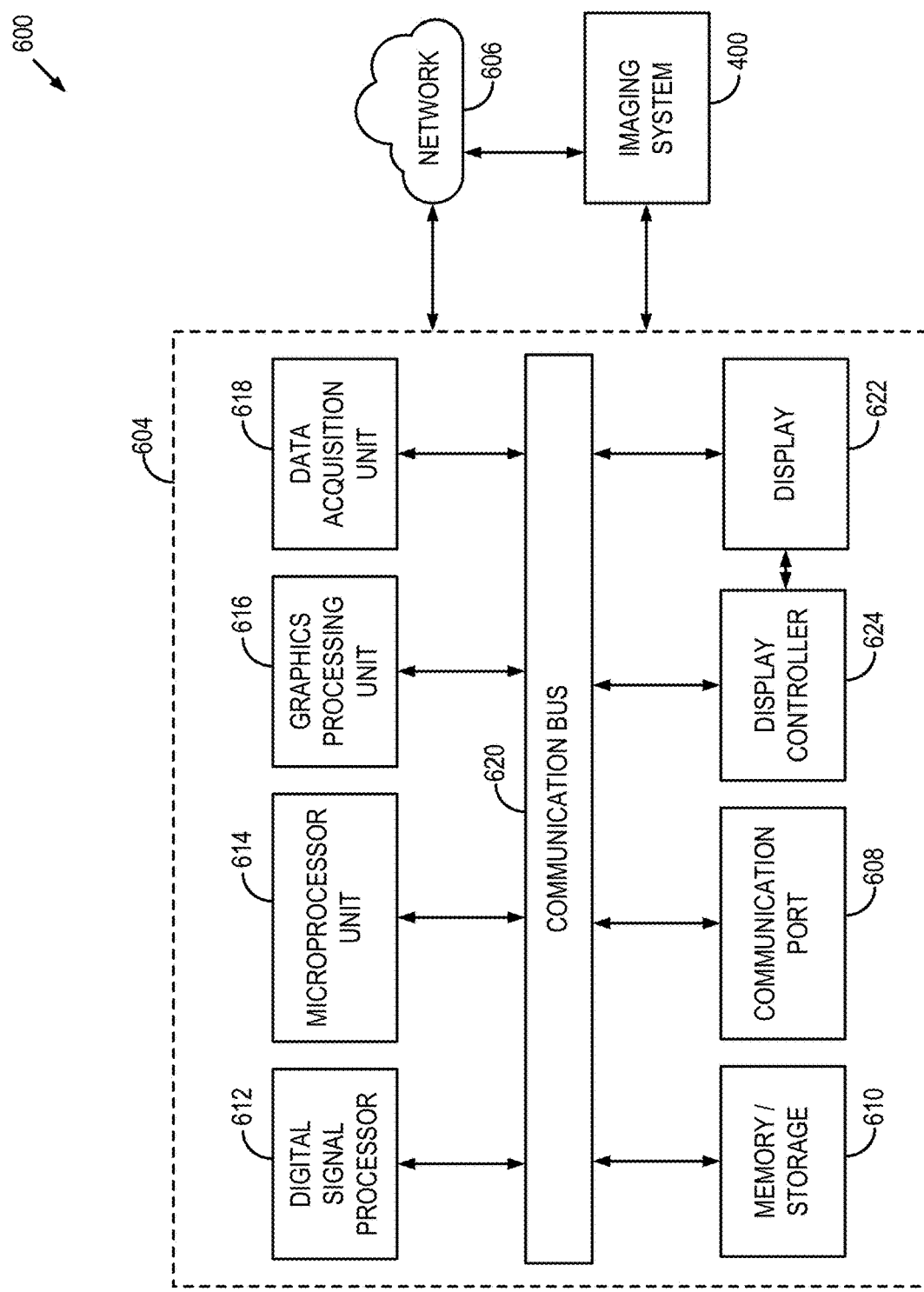
FIG. 6 is a block diagram of an example system that can be configured to carry out techniques, methods, and processes accordance with the present disclosure.

Finally, the above-described system can be incorporated into a computer or other systems. In particular, FIG. 6 is a block diagram of an example system 600 that can be configured to carry out techniques, methods, and processes accordance with the present disclosure. The system 600 may include the above-described EPRI system 400, which may be coupled to a computer system 604. The coupling of the EPRI system 400 to the computer system 604 may be a direct or dedicated network connection, or may be through a broad network 16, such as an intranet or the Internet.

The computer system 604 may be a workstation integrated with or separate from the medical imaging systems 400 or a variety of other medical imaging systems, including, as non-limiting examples, computed tomography (CT) system, magnetic resonance imaging (MRI) systems, positron emission tomography (PET) systems, single photon emission computed tomography (SPECT) systems, and the like. Furthermore, the computer system 604 may be a workstation integrated within the medical imaging system 400 or may be a separate workstation or mobile device or computing system. To this end, the following description of particular hardware and configurations of the hardware of the example computer system 604 is for illustrative purposes. Some computer systems may have varied, combined, or different hardware configurations.

Medical imaging data acquired by the medical imaging system 400 or other imaging system can be provided to the computer system 604, such as over a network 606 or from a storage device. To this end, the computer system 604 may include a communications port or other input port 608 for communication with the network 606 and system coupled thereto. Also, the computer system 604 may include memory and storage capacity 610 to store and access data or images.

In some configuration, computer system 604 may include one or more processing systems or subsystems. That is, the computer system 604 may include one or more physical or virtual processors. As an example, the computer system 604 may include one or more of a digital signal processor (DSP) 612, a microprocessor unit (MPU) 614, and a graphics processing unit (GPU) 616. If the computer system 604 is integrated into the medical imaging system, a data acquisition unit 618 may be connected directly to processor(s) 612, 614, 616 over a communications bus 620, instead of communicating acquired data or images via the network 606. As an example, the communication bus 620 can be a group of wires, or a hardwire used for switching data between the peripherals or between any component, such as the communication buses described above.

The computer system 604 may also include or be connected to a display 622. To this end, the computer system 604 may include a display controller 624. The display 622 may be a monitor connected to the computer system 604 or may be integrated with the computer system 604, such as in portable computers or mobile devices.

The present invention has been described in terms of one or more preferred embodiments, and it should be appreciated that many equivalents, alternatives, variations, and modifications, aside from those expressly stated, are possible and within the scope of the invention.

The invention claimed is:

1. An electron paramagnetic resonance imaging (EPRI) system comprising:
   a magnet configured to apply a static magnetic field to a subject to be imaged;
   a gradient coil configured to apply a magnetic field gradient to the static magnetic field;
   a transmission line forming a waveguide configured to use a traveling wave to generate a radio frequency (RF) magnetic field over a volume of interest (VOI) in the subject to elicit EPRI data from the VOI; and
   a processor configured to reconstruct the EPRI data into an image of the VOI.

2. The EPRI system of claim 1 wherein the transmission line is coupled to an RF source configured to drive the transmission line to generate the RF magnetic field by generating a traveling wave.

3. The EPRI system of claim 1 further comprising a receiver system to acquire electron paramagnetic resonance (EPR) signals from the VOI in response to the RF magnetic field generated by the transmission line.

4. The EPRI system of claim 3 wherein the receiver system include an EPRI resonator.

5. The EPRI system of claim 4 further comprising a lock-in amplifier coupled to the resonator to receive the EPR signals and form the EPRI data.

6. The EPRI system of claim 4 wherein the processor is configured to control the transmission line and the resonator to operate in transmission mode.

7. The EPRI system of claim 1 wherein the magnet is configured to generate a magnetic field of less than 1 Tesla.

8. The EPRI system of claim 1 wherein the wave guide forms a parallel plate waveguide (PPWG).

9. The EPRI system of claim 8 wherein the parallel plate are coupled through an antenna.

10. The EPRI system of claim 9 wherein the antenna is a monopole antenna.

11. The EPRI system of claim 8 further comprising resistive terminations between the parallel plates.

12. The EPRI system of claim 1 wherein the subject is a human and the VOI is a volume within the human.

13. The EPRI system of claim 1 wherein the processor is configured to control the EPRI system to operate according to a pulsed EPRI process.

14. The EPRI system of claim 1 wherein the processor is configured to control the EPRI system to operate according to a continuous wave (CW) EPRI process.

15. An electron paramagnetic resonance imaging (EPRI) system comprising:
    a magnet configured to apply a static magnetic field to a subject to be imaged;
    a gradient coil configured to apply a magnetic field gradient to the static magnetic field;
    a parallel plate waveguide (PPWG) configured to use a traveling wave to generate a radio frequency (RF) magnetic field over a volume of interest (VOI) in the subject to elicit EPRI data from the VOI; and
    a processor configured to reconstruct the EPRI data into an image of the VOI.

16. The EPRI system of claim 15 further comprising a receiver system including an EPRI resonator configured to acquire electron paramagnetic resonance (EPR) signals from the VOI in response to the RF magnetic field generated by the PPWG.

17. The EPRI system of claim 16 wherein the processor is configured to control the PPWG and the resonator to operate in transmission mode.

18. The EPRI system of claim 15 wherein the PPWG forms includes parallel plates forming a transmission line.

19. The EPRI system of claim 18 wherein the parallel plates are coupled through an antenna.

20. The EPRI system of claim 15 wherein the processor is configured to control the EPRI system to selectively operate according to either a pulsed EPRI process or a continuous wave (CW) EPRI process.

21. The EPRI system of claim 1 wherein the wave guide is configured to create transverse electromagnetic (TEM)

waves to generate the RF magnetic field over the VOI in the subject to elicit EPRI data from the VOI.

* * * * *